United States Patent
Linares et al.

(10) Patent No.: US 6,442,032 B1
(45) Date of Patent: Aug. 27, 2002

(54) ETHERNET SWITCH MODULE AND SYSTEM

(75) Inventors: Ignacio A. Linares, Plano; James C. McKinley, Frisco; Teck Q. Chin, Richardson; Dennis J. Harkin, Plano, all of TX (US)

(73) Assignee: Alcatel, societe anonyme, Paris (FR)

( * ) Notice: Subject to any disclaimer, the term of this patent is extended or adjusted under 35 U.S.C. 154(b) by 0 days.

(21) Appl. No.: 09/928,186

(22) Filed: Aug. 10, 2001

(51) Int. Cl.$^7$ ................................. H05K 7/02
(52) U.S. Cl. .................. 361/728; 361/729; 361/730; 361/631; 312/223.1; 312/223.2; 455/84; 455/90; 379/434; 379/440; 439/928.1
(58) Field of Search ................... 361/724.729, 631, 361/684, 686; 312/223.1, 223.2; 455/84, 90; 379/434, 440; 439/928.1

(56) References Cited

U.S. PATENT DOCUMENTS

| | | | | |
|---|---|---|---|---|
| 4,527,285 A | * | 7/1985 | Kekas et al. | 359/152 |
| 5,345,446 A | * | 9/1994 | Hiller et al. | 370/60.1 |
| 5,737,334 A | * | 4/1998 | Prince et al. | 370/395 |
| H1801 H | * | 9/1999 | Browning et al. | 379/9 |
| 6,058,288 A | * | 5/2000 | Reed et al. | 455/60.3 |
| 6,052,383 A | * | 8/2000 | Stoner et al. | 370/466 |
| 6,148,352 A | * | 11/2000 | Coale et al. | 710/100 |

* cited by examiner

Primary Examiner—Darren Schuberg
Assistant Examiner—David Foster
(74) Attorney, Agent, or Firm—Jackson Walker, LLP; V. Lawrence Sewell; Craig A. Hoersten

(57) ABSTRACT

An apparatus and system is provided for coupling an ethernet switch to communication link(s) in a communication network without requiring the disconnection and reconnection of the communication link(s). A module is configured to accommodate components of an ethernet switch, and can be modularly introduced into a communication rack and quickly engaged with rack-mounted mating connectors which are coupled to the communication link(s).

20 Claims, 3 Drawing Sheets

ETHERNET SWITCH MODULE AND SYSTEM

BACKGROUND OF THE INVENTION

1. Technical Field of the Invention

The present invention relates generally to the field of communications and, more particularly to an ethernet switch system.

2. Description of Related Art

As communications systems adapt or evolve toward the use of embedded ethernet switches, it becomes necessary to be able to install, remove and service the units with minimal effort and time. Commercial ethernet products require a large field of connectors. Currently, switches may require connectors for a plurality of 100 Mb/s ethernet ports and/or a plurality of gigabit ethernet ports. As the switches and associated systems evolve, even more communication connectors are expected to be used. Installing or removing such a large number of cables becomes more time consuming and complicated as the number of cable connections increases. Handling higher numbers of connectors will also be more error prone, thus requiring a higher level of expertise for in-field installation, upgrades and service, particularly in high-reliability communication systems.

Further complicating current ethernet switch configurations is the fact that connections are arranged in a front portion of the switch unit. Ethernet switches are currently adapted to be received in a stacked-tray or racking system in which several racks can be arranged side-by-side. The switches are stacked or installed into a rack from the front and all associated cables are then routed to the front of the switch for connection. For those circumstances which require the switch to be remove and/or replaced (such as for repair or upgrade) the associated cables must be removed and re-installed.

Therefore, there is a need for a system and apparatus for installing, removing and servicing ethernet switches in a communication network with minimal effort, time, and/or expertise.

SUMMARY OF THE INVENTION

The present invention achieves technical advantages as an apparatus and system for coupling an ethernet switch to a communication link(s) in a communication network. A module is configured with a height and width for accommodating the ethernet switch and can be installed in an industry standard rack. The module includes a plurality of first connectors which are electrically coupled to the ethernet switch and are engagable with a plurality of second connectors included in a housing adapted to be affixed to the rack. The housing is also configured with a plurality of third connectors which are electrically coupled to the plurality of second connectors and which couple to the communication link(s). The plurality of first connectors and plurality of second connectors are engaged as the module is introduced from the front to the back of the communication rack.

BRIEF DESCRIPTION OF THE DRAWINGS

For a more complete understanding of the present invention, reference is made to the following detailed description taken in conjunction with the accompanying drawings wherein.

DETAILED DESCRIPTION OF THE INVENTION

The numerous innovative teachings of the present application will be described with particular reference to the presently preferred exemplary embodiments. However, it should be understood that this class of embodiments provides only a few examples of the many advantageous uses and innovative teachings herein. In general, statements made in the specification of the present application do not necessarily delimit any of the various claimed inventions. Moreover, some statements may apply to some inventive features, but not to others.

Figure 1A:
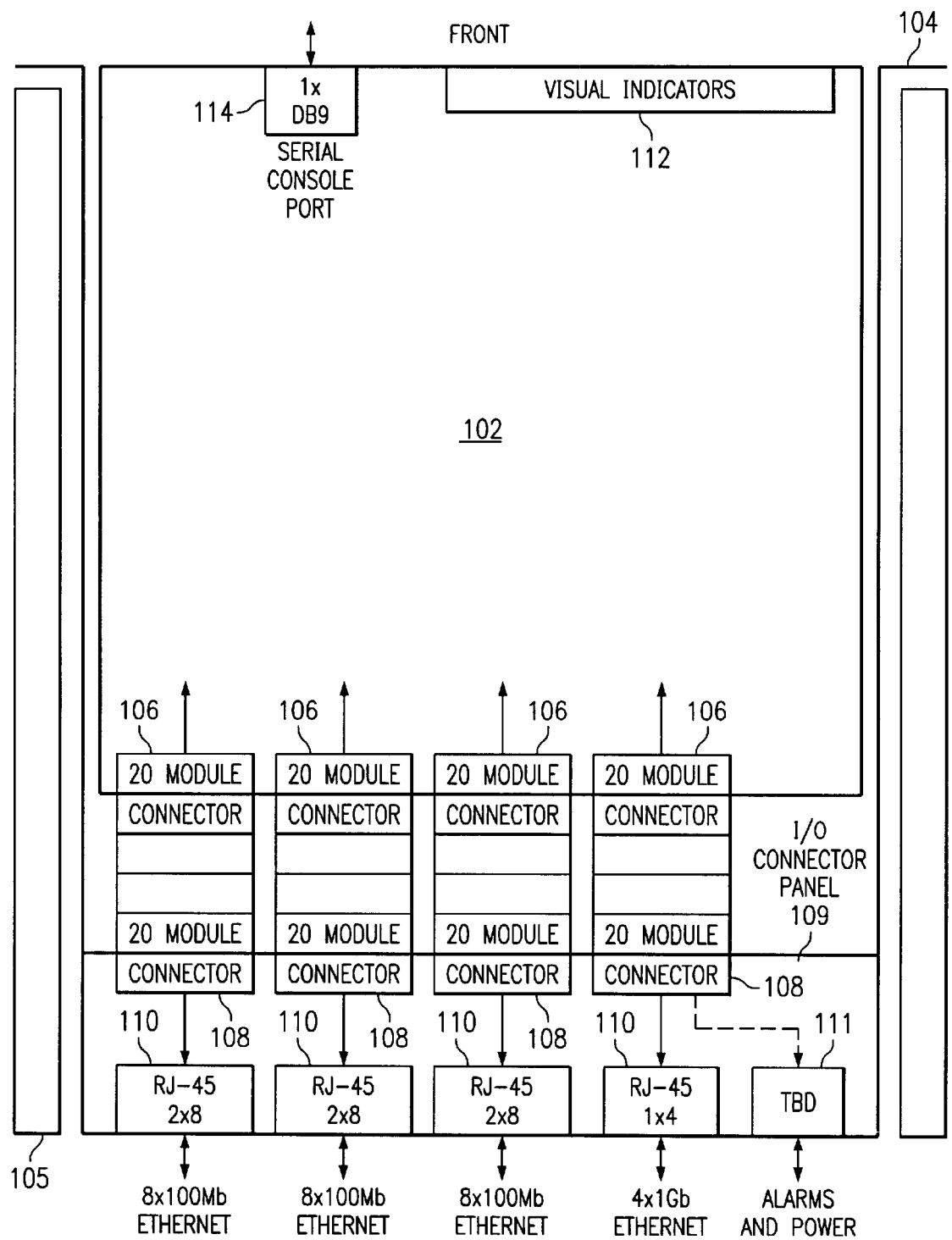
FIG. 1A illustrates a top view of a simplified diagram of a switch module and housing in accordance with an exemplary embodiment of the present invention.

Referring now to FIG. 1A, there is illustrated a top view of a simplified diagram of an ethernet switch module 102 and housing 104 in accordance with an exemplary embodiment of the present invention. The module 102 is shown in an installed position within a communication rack 105. The module 102 includes a plurality of connectors 106 (as in this embodiment, connectors 106 are high density/high speed electrical connectors) affixed to a rear portion of the module 102 for connecting ethernet, power and alarm signals.

Electronics and support equipment for an ethernet switch are accommodated in the removable module 102. A front portion of the module 102 can include visual (e.g. LED) indicators 112 or other types of machine-to-man interfaces and can include a portal 114 for a machine-to-machine interface for operation monitoring, maintenance, troubleshooting, etc. The connectors 106 are also electrically coupled to the ethernet switch electronics and support equipment within the module 102. In at least one embodiment, the ethernet switch is totally contained within the module 102 so that servicing a failed switch comprises replacing the entire module 102.

Figure 1B:
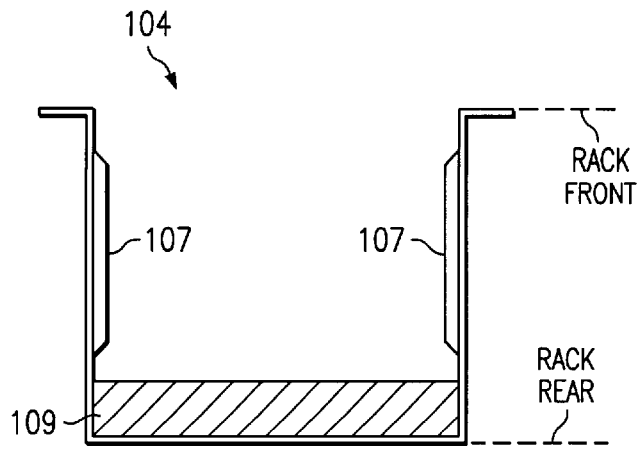
FIG. 1B illustrates a top view of the housing illustrated in FIG. 1A.

The housing 104 includes an I/O connector panel 109 supporting a corresponding plurality of connectors 108 ( as in this embodiment, connectors 108 are high density/high speed electrical connectors) for breaking out the signals into their respective connectors (e.g. RJ45, Alarms, Power). The connectors 108 can be, for example, Teradyne 6-row VHDM type connectors. The connectors 108 are affixed to a front portion of an I/O connector panel 109. The I/O connector panel 109 is affixed to a rear portion of housing 104 in which the housing 104 is removeably affixed in the rack 105. The housing 104 can also include support guides 107 (see FIG. 1B) for guiding the introduction of the module 102 and to enable engagement alignment of connectors 106 and 108 as the module 102 is introduced or slid from front to back into the rack 105. The housing 104 is configured to be mountable in the rack 105 prior to and without requiring the installation of the module 102.

Connectors 108 are electrically coupled to connectors 110. Connectors 110 are configured to accept communication lines or cables from a communication network. In this embodiment, connectors 110 are shown as industry standard RJ-45 electrical connectors. The RJ-45 connectors, as shown, are configured to support forty-eight 100 Mb/s ethernet ports and four gigabit ethernet ports. The 100 Mb/s (fast ethernet) RJ-45 connections are realized via a stacked 2X8 RJ-45 connector. The gigabit ethernet RJ-45 connections are realized via a 1X4 RJ-45 connector. In another embodiment, the I/O connector panel 109 is configured to support eighteen gigabit ethernet ports using individual RJ-45 connectors. It should be appreciated that similar type connectors and other combinations are contemplated. Connector 111 can also be included to accept lines such as for power and alarm notification.

In an installed position, the rear portion of the I/O connector panel 109 corresponds to the rear of the rack 105. Connectors 110 and 111 are affixed to a rear portion of the I/O connector panel 109 such that they are accessible from the rear of the rack 105 for connection to the communication lines or cables and/or power and alarm lines.

Module 102 is a modular component which can be readily installed and/or removed when necessary. Insertion and removal of the module 102 allows easy connect and disconnect of mating connectors 106 and 108 and does not require the removal and re-installation of the installed communication lines or cables and/or power and alarm lines.

Mating connectors 106 and 108 comprise a male and female mating portion and obviously are interchangeable. That is to say, any given male/female type connector has a corresponding female/male type connector. The housing 104 can also include a locking mechanism in order to hold the module 102 in position after the module 102 has been slid along the support guides 107 to bring the connector's mating portions into their fully engaged positions. The locking mechanism can also be configured as part of the module 102.

Figure 1C:
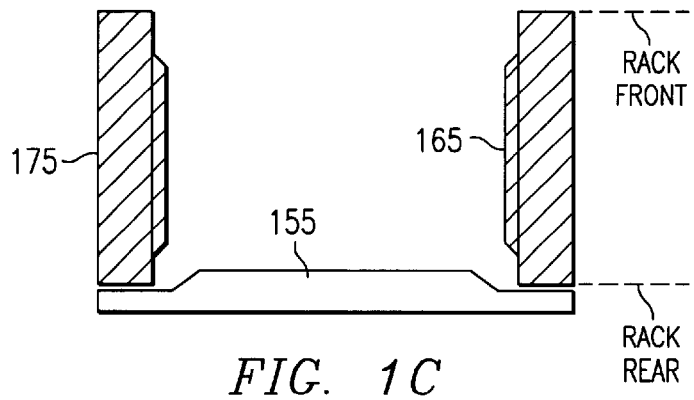
FIG. 1C illustrates a top view of a housing in accordance with another embodiment of the present invention.

FIG. 1C illustrates a top view of a rack 175 and housing 155 in accordance with another embodiment of the present invention. In this embodiment, a connector I/O panel 155 supports connectors 108 and connectors 110 which are electrically connected. As shown, the connector I/O panel 155 is mounted to the rear of the rack 175, and one or more guides 165 are included in the rack 175.

Figure 2:
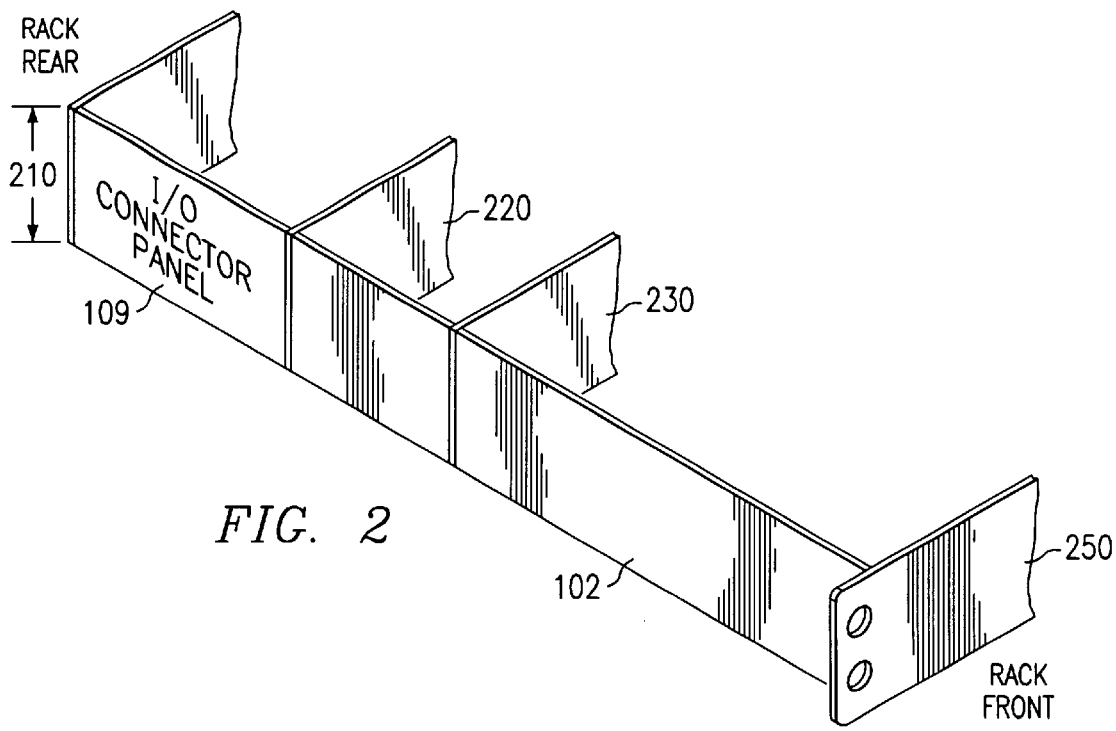
FIG. 2 illustrates a front perspective view of a switch module and housing installed in a rack in accordance with an exemplary embodiment of the present invention.

Referring now to FIG. 2, there is illustrated a front perspective view of the housing 104 and I/O connector panel 109 shown in FIG. 1A. Item 250 illustrates the location of a front face of the module 102 in an installed position. Item 230 illustrates the rear portion of the module 102 in an installed position. Item 220 shows the front portion of the I/O connector panel 109.

Generally, rack space is measured in rack units (RU) in which 1 RU is 1.75 inches. In at least one embodiment of the present invention, the housing 104 and module 102 are configured to a height (item 210) of 1 RU. In other embodiments, the housing 104 and module 102 are configured to a height (item 210) of 1.5 RU.

Figure 3:
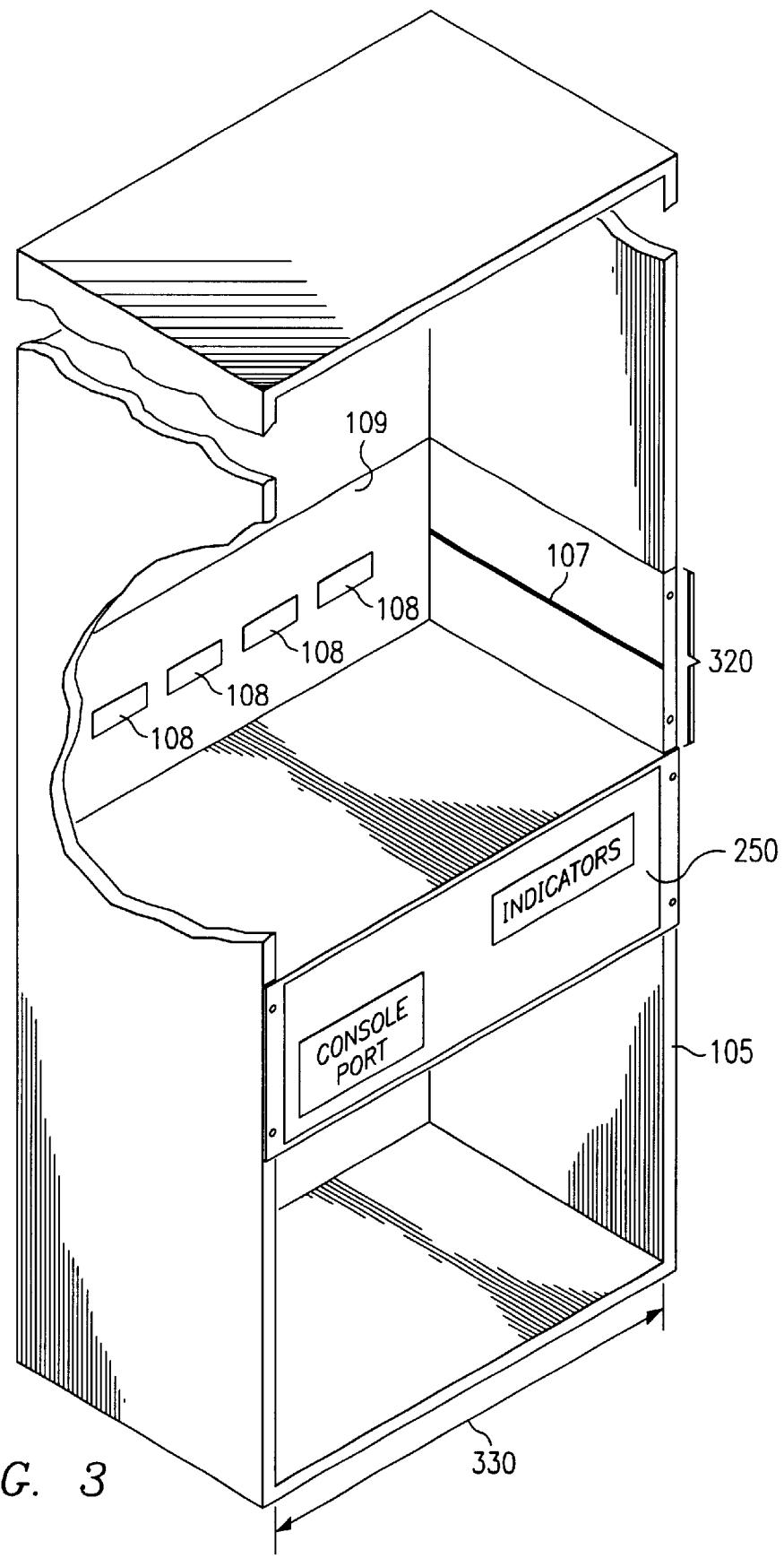
FIG. 3 illustrates a front perspective view of a rack in accordance with an exemplary embodiment of the present invention.

Referring now to FIG. 3, there is illustrated a front perspective view of a communications rack 105 in accordance with an exemplary embodiment of the present invention. The rack 105 can include a number of housings for receiving modules. Item 320 illustrates an installed housing 104 (of the type illustrated in FIG. 1B). Also shown are connectors 108 of the I/O connector panel 109 and one of the two support guides 107 (see FIG. 1B). In the housing just below item 320 is shown an installed module 102 with a front face plate 250. The module 102 includes guide grooves (not explicitly shown) in the lateral sides thereof that mate and slidingly cooperate with the support guides 107 or 165 (see FIG. 1C).

In at least one embodiment of the present invention, the module 102 has an overall depth, from front to back, to enable the face plate 250 to be aligned flush with the front of the rack 105 while the connectors 106 and 108 are fully engaged. However, the module 102 can be configured with a depth to enable the face plate 250 to be recessed or protrude with respect to the front of the rack 105, while the connectors 106 and 108 are fully engaged.

The area above item 320 and below face plate 250 is shown as being empty, however, this area can receive other housings 104 for additional modules 102 or other support type equipment. The width (as shown by item 330) is generally 19 inches, a standard in the industry.

Although a preferred embodiment of the method and system of the present invention has been illustrated in the accompanied drawings and described in the foregoing Detailed Description, it is understood that the invention is not limited to the embodiments disclosed, but is capable of numerous rearrangements, modifications, and substitutions without departing from the spirit of the invention as set forth and defined by the following claims.

What is claimed is:

1. A system for coupling an ethernet switch to a communication link in a communication network, said system comprising:
    a module comprising:
        a height and width for accommodating therein said ethernet switch; and
        a plurality of first connectors affixed to a rear portion of said module and electrically coupled to said ethernet switch, said plurality of first connectors further configured with a mating portion for engagement with a plurality of second connectors;
    a housing having a plurality of third connectors for coupling to said communication link, said plurality of second connectors affixed to said housing and electrically coupled to said plurality of third connectors; and
    a rack having a front and a rear, said housing removably affixed to said rack and positioned to enable engagement of said plurality of first connectors and said plurality of second connectors when said module is introduced from said front to said rear of said rack.

2. The system of claim 1, wherein a front face portion of said module is flush with said rack front when said plurality of first connectors and said plurality of second connectors are engaged.

3. The system of claim 1, wherein said plurality of third connectors comprise RJ-45 connectors for coupling to said communication link.

4. The system of claim 1, wherein one of said rack and said housing further comprises a support for guiding said introduction of said module to enable engagement alignment of said plurality of first connectors and said plurality of second connectors.

5. The system of claim 1, wherein said module further comprises a machine-to-man interface affixed to a front face portion for indicating ethernet switch operation status.

6. The system of claim 5, wherein said machine-to-man interface is a visual interface.

7. The system of claim 5, wherein said machine-to-man interface is a signaling interface.

8. The system of claim 1, wherein said plurality of first connectors and said plurality of second connectors are operable to support a plurality of gigabit ethernet ports.

9. The system of claim 1, wherein said module height is approximately 1.75 inches.

10. The system of claim 1, wherein said module height is approximately 2.63 inches.

11. The system of claim 1, wherein said module width is approximately 19 inches.

12. A rack for coupling a modular ethernet switch to a communication link, said modular ethernet switch comprising an engagable plurality of first connectors affixed to a rear portion of said modular ethernet switch, said rack comprising:

a front and a rear configured to enable introduction of said modular ethernet switch from said front to said rear, and a housing having a plurality of second connectors configured to engage to said plurality of first connectors and electrically coupled to a plurality of third connectors, said plurality of third connectors operable for coupling to said communication link, said housing positioned to enable engagement of said plurality of first connectors and said plurality of second connectors when said modular ethernet switch is introduced from said front to said rear of said rack.

13. The rack of claim 12 further comprising a guide cooperable with said modular ethernet switch to enable engagement alignment of said plurality of first connectors and said plurality of second connectors.

14. The rack of claim 12, wherein said plurality of third connectors comprise RJ-45 connectors for coupling to said communication link.

15. The rack of claim 12, wherein said plurality of second connectors are operable to support a plurality of gigabit ethernet ports.

16. The rack of claim 12 further having a width of approximately 19 inches.

17. A module for coupling an ethernet switch to a communication link in a rack comprising a front and a rear, wherein said rear includes a plurality of second connectors electrically coupled to a plurality of third connectors for coupling to said communication link, said module comprising:

a height and width for accommodating therein said ethernet switch; and a plurality of first connectors affixed to a rear portion of said module and electrically coupled to said ethernet switch, said plurality of first connectors further configured with a mating portion for engagement to said plurality of second connectors when said module is introduced from said front to said rear of said rack.

18. The module of claim 17, wherein said plurality of first connectors are operably configured to support a plurality of gigabit ethernet ports.

19. The module of claim 17 further including a guide structure cooperable with said rack to enable engagement alignment of said plurality of first connectors and said plurality of second connectors.

20. The module of claim 17, wherein said module is removable with said plurality of third connectors coupled to said communication link.

\* \* \* \* \*